US006410151B1

(12) United States Patent
Kurosawa et al.

(10) Patent No.: US 6,410,151 B1
(45) Date of Patent: Jun. 25, 2002

(54) COMPOSITION FOR FILM FORMATION, METHOD OF FILM FORMATION, AND INSULATING FILM

(75) Inventors: Takahiko Kurosawa, Goleta, CA (US); Eiji Hayashi, Ibaraki (JP); Seo Youngsoon, Ibaraki (JP); Atsushi Shiota, Ibaraki (JP); Kinji Yamada, Ibaraki (JP)

(73) Assignees: JSR Corporation; Kabushiki Kaisha Toshiba, both of Tokyo (JP)

( * ) Notice: Subject to any disclaimer, the term of this patent is extended or adjusted under 35 U.S.C. 154(b) by 0 days.

(21) Appl. No.: 09/670,547

(22) Filed: Sep. 27, 2000

(30) Foreign Application Priority Data

Sep. 29, 1999 (JP) ............................................ 11-275554

(51) Int. Cl.⁷ ................................................. B32B 9/04
(52) U.S. Cl. ........................... 428/447; 528/16; 528/17; 528/34; 528/32; 528/33; 525/100; 427/372; 427/387
(58) Field of Search .................. 428/477; 525/100–106, 525/475, 477; 528/34, 39, 21; 11/11

(56) References Cited

U.S. PATENT DOCUMENTS 5,733,644 A * 3/1998 Tanaka et al. ............... 428/215
5,872,194 A * 2/1999 Isshiki et al. ................ 525/476
6,043,330 A * 3/2000 Hacker et al. ................ 528/12

FOREIGN PATENT DOCUMENTS

JP          61-56870         12/1986

OTHER PUBLICATIONS

Co–pending Application Claims for 09/791619, 09/778822.*

* cited by examiner

*Primary Examiner*—Robert Dawson
*Assistant Examiner*—Christopher M. Keehan
(74) *Attorney, Agent, or Firm*—Oblon, Spivak, McClelland, Maier & Neustadt, P.C.

(57) ABSTRACT

A polyorganosiloxane-based composition for film formation which gives a film having low dielectric constant and high modulus of elasticity and useful as an interlayer insulating film in semiconductor devices and the like.

The composition for film formation comprises: (A) a product of hydrolysis and condensation obtained by hydrolyzing and condensing, in the presence of an alkali catalyst, at least one member selected from the group consisting of compounds (1) represented by $R_aSi(OR^1)_{4-a}$ (wherein R represents hydrogen, fluorine, or a monovalent organic group; $R^1$ represents a monovalent organic group; and a Is an integer of 1 or 2), compounds (2) represented by $Si(OR^2)_4$ (wherein $R^2$ represents a monovalent organic group), and compounds (3) represented by $R^3{}_b(R^4O)_{3-b}Si-(R^7)_d-Si(OR^5)_{3-c}R^6{}_c$ [wherein $R^3$ to $R^6$ may be the same or different and each represent a monovalent organic group; b and c may be the same or different and each are an integer of 0 to 2; $R^7$ represents oxygen, phenylene, or a group represented by $-(CH_2)_n-$, wherein n is an integer of 1 to 6; and d is 0 or 1]; and (B) a product of hydrolysis and condensation obtained by hydrolyzing and condensing, in the presence of a metal chelate compound catalyst, at least one member selected from the group consisting of the compounds (1), (2), and (3).

8 Claims, No Drawings

COMPOSITION FOR FILM FORMATION, METHOD OF FILM FORMATION, AND INSULATING FILM

FIELD OF THE INVENTION

The present invention relates to a polyorganosiloxane-based composition for film formation. More particularly, the invention relates to a polyorganosiloxane-based composition for film formation which, when used as an interlayer insulating film material in the production of semiconductor devices and the like, can give a film having a low dielectric constant and high modulus of elasticity.

BACKGROUND OF THE INVENTION

Silica ($SiO_2$) films formed by vacuum processes such as CVD method have hitherto been used frequently as interlayer insulating films in semiconductor devices and the like. In recent years, an insulating coating film which comprises a tetraalkoxysilane hydrolyzate as the main component and is called an SOG (spin on glass) film has come to be used for the purpose of forming a more even interlayer insulating film. Furthermore, as a result of trend toward higher degree of integration in semiconductor devices and the like, an interlayer insulating film has been developed which comprises a polyorganosiloxane as the main component, has a low dielectric constant, and is called an organic SOG film.

However, the dielectric constants of the currently known organic SOG films are about from 3 to 4, and no organic SOG film is known which has a lower dielectric constant than those and has sufficient mechanical strength.

SUMMARY OF THE INVENTION

Accordingly, one object of the invention is to provide a composition for film formation that overcomes the problems described above.

Another object of the invention is to provide a polyorganosiloxane-based composition for film formation which is capable of giving a cured film having a low dielectric constant and high modulus of elasticity and useful as an interlayer insulating film in semiconductor devices and the like.

The invention provides a composition for film formation which comprises (A) a product of hydrolysis and condensation (hereinafter referred to as a "product of hydrolysis and condensation (A)") obtained by hydrolyzing and condensing, in the presence of an alkali catalyst, at least one silane compound selected from the group consisting of compounds represented by the following formula (1) (hereinafter referred to as "compounds (1)"), compounds represented by the following formula (2) (hereinafter referred to also as "compounds (2)"), and compounds represented by the following formula (3) (hereinafter referred to as "compounds (3)") and (B) a product of hydrolysis and condensation (hereinafter referred to also as "product of hydrolysis and condensation (B)") obtained by hydrolyzing and condensing, in the presence of a metal chelate compound catalyst, at least one silane compound selected from the group consisting of the compounds (1), the compounds (2), and the compounds (3):

$$R_a Si(OR^1)_{4-a} \quad (1)$$

wherein R represents hydrogen atom, fluorine atom, or a monovalent organic group; $R^1$ represents a monovalent organic group; and a is an integer of 1 or 2;

$$Si(OR^2)_4 \quad (2)$$

wherein $R^2$ represents a monovalent organic group;

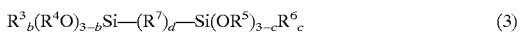

wherein $R^3$ to $R^6$ may be the same or different and each represent a monovalent organic group; b and c may be the same or different and each are an integer of 0 to 2; $R^7$ represents oxygen atom, a phenylene group, or a group represented by $-(CH_2)_n-$, wherein n is an integer of 1 to 6; and d is 0 or 1.

In this composition, the product of hydrolysis and condensation (A) preferably has a weight average molecular weight as determined by GPC of from 50,000 to 3,000,000.

The product of hydrolysis and condensation (B) preferably has a weight average molecular weight as determined by GPC of from 500 to 300,000.

The ingredient (A) preferably contains a product of the hydrolysis and condensation of at least one compound represented by the formula (2) in an amount of from 25 to 75% by weight (in terms of the product of complete hydrolysis and condensation)

Furthermore, the ingredients (A) and (B) are preferably contained in such a proportion that the amount of the ingredient (B) is from 1 to 900 parts by weight (in terms of the product of complete hydrolysis and condensation) per 100 parts by weight of the ingredient (A) (in terms of the product of complete hydrolysis and condensation).

The invention further provides a method of film formation which comprises applying the composition for film formation described above on a substrate and then heating the composition.

A preferred application of the film obtained by the method of film formation described above is an insulating film.

The invention furthermore provides a semiconductor device having the insulating film.

DETAILED DESCRIPTION OF THE INVENTION

The composition for film formation of the invention is a polyorganosiloxane-based composition which contains ingredient (A) [a product of hydrolysis and condensation (a hydrolyzate and/or a condensate thereof) obtained by hydrolyzing and condensing, in the presence of an alkali catalyst, at least one member selected from the group consisting of compounds (1), (2), and (3)] and ingredient (B) [a product of hydrolysis and condensation (a hydrolyzate and/or a condensate thereof) obtained by hydrolyzing and condensing, in the presence of a metal chelate compound catalyst, at least one member selected from the group consisting of compounds (1), (2), and (3)] as film-forming base polymers. When this composition of the invention is applied to a substrate such as, e.g., a silicon wafer by dipping, spin coating, or another technique and the composition applied is heated to thermally condensation-polymerize the ingredients (A) and (B), then the ingredients (A) and (B) give a vitreous or macromolecular weight film which has a low dielectric constant, high modulus of elasticity, and hence excellent mechanical strength. Thus, an interlayer insulating film material can be formed.

The term "hydrolysis" as used herein means that the $R^1O-$, $R^2O-$, $R^4O-$, and $R^5O-$ groups in compounds (1) to (3) to constitute ingredients (A) and (B) react with water to produce silanol groups.

The term "condensation" as used herein means that silanol groups of the hydrolyzates of compounds (1) to (3) to constitute ingredients (A) and (B) are condensed to form Si—O—Si bonds. In the invention, however, all the silanol groups need not have undergone condensation. Namely, the condensation include the production of a condensate in which a slight proportion of the silanol groups have been condensed and the production of a mixture of condensates which differ in the degree of condensation.

Product of Hydrolysis and Condensation (A)

The product of hydrolysis and condensation (A) is obtained by hydrolyzing and condensing, in the presence of an alkali catalyst, at least one silane compound selected from the group consisting of compounds (1) to (3). Compounds (1) to (3) and the alkali catalyst are described below.

Compounds (1):

Examples of the monovalent organic groups represented by R and $R^1$ in the formula (1) include alkyl group, aryl group, allyl group, and glycidyl group. In the formula (1), R is preferably a monovalent organic group, especially alkyl group or phenyl group.

The alkyl group preferably has 1 to 5 carbon atoms, and examples thereof include methyl, ethyl, propyl, and butyl. Those alkyl groups may be linear or branched, and may be ones in which one or more of the hydrogen atoms have been replaced with, for example, fluorine atoms.

In the formula (1), examples of the aryl group include phenyl, naphthyl, methylphenyl, ethylphenyl, chlorophenyl, bromophenyl, and fluorophenyl.

Specific examples of the compounds represented by the formula (1) include:

trimethoxysilane, triethoxysilane, tri-n-propoxysilane, triisopropoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotriisopropoxysilane, fluorotri-n-butoxysilane, fluorotri-sec-butoxysilane, fluorotri-tert-butoxysilane, and fluorotriphenoxysilane; methyltrimethoxysilane, methyltriethoxysilane, methyltri-n-propoxysilane, methyltri-iso-propoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-tert-butoxysilane, ethyltriphenoxysilane, vinyltrimethoxysilane, vinyltriethoxysilane, vinyltri-n-propoxysilane, vinyltri-iso-propoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, vinyltrimethoxysilane, vinyltriethoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, and γ-trifluoropropyltriethoxysilane; and dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldiphenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, and divinyltrimethoxysilane.

Of those, the preferred compounds are methyltrimethoxysilane, methyltriethoxysilane, methyltri-n-propoxysilane, methyltriisopropoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, and diphenyldiethoxysilane.

Those compounds may be used alone or as a mixture of two or more thereof.

Compounds (2):

Examples of the monovalent organic group in the formula (2) include the same organic groups as those enumerated above with regard to the formula (1).

Examples of the compounds represented by the formula (2) include tetramethoxysilane, tetraethoxysilane, tetra-n-propoxysilane, tetraisopropoxysilane, tetra-n-butoxysilane, tetra-sec-butoxysilane, tetra-tert-butoxysilane, and tetraphenoxysilane.

Compounds (3):

Examples of the monovalent organic groups in the formula (3) include the same organic groups as those enumerated above with regard to the formula (1).

Examples of the compounds represented by the formula (3) wherein $R^7$ is oxygen atom include hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentaphenoxy-3-methyldisiloxane, 1,1,1,3,3-pentamethoxy-3-ethyldisiloxane, 1,1,1,3,3-pentaethoxy-3-ethyldisiloxane, 1,1,1,3,3-pentaphenoxy-3-ethyldisiloxane, 1,1,1,3,3-pentamethoxy-3-phenyldisiloxane, 1,1,1,3,3-pentaethoxy-3-phenyldisiloxane, 1,1,1,3,3-pentaphenoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetraphenoxy-1,3-dimethyldisiloxane, 1,1,3,3-tetramethoxy-1,3-diethyldisiloxane, 1,1,3,3-tetraethoxy-1,3-diethyldisiloxane, 1,1,3,3-tetraphenoxy-1,3-diethyldisiloxane, 1,1,3,3-tetramethoxy-1,3-diphenyldisiloxane, 1,1,3,3-tetraethoxy-1,3-diphenyldisiloxane, 1,1,3,3-tetraphenoxy-1,3-diphenyldisiloxane, 1,1,3-trimethoxy- 1,3,3-trimethyldisiloxane, 1,1,3-triethoxy-1,3,3-trimethyldisiloxane, 1,1,3-triphenoxy-1,3,3-trimethyldisiloxane, 1,1,3-trimethoxy-1,3,3-triethyldisiloxane, 1,1,3-triethoxy-1,3,3-triethyldisiloxane, 1,1,3-triphenoxy-1,3,3-triethyldisiloxane, 1,1,3-trimethoxy-1,3,3-triphenyldisiloxane, 1,1,3-triethoxy-1,3,3-triphenyldisiloxane, 1,1,3-triphenoxy-1,3,3-triphenyldisiloxane, 1,3-dimethoxy-1,1,3,3-tetramethyldisiloxane, 1,3-diethoxy-1,1,3,3-tetramethyldisiloxane, 1,3-diphenoxy-1,1,3,3-tetramethyldisiloxane, 1,3-dimethoxy-1,1,3,3-tetraethyldisiloxane, 1,3-diethoxy-1,1,3,3-tetraethyldisiloxane, 1,3-diphenoxy-1,1,3,3-tetraethyldisiloxane, 1,3-dimethoxy-1,1,3,3-tetraphenyldisiloxane, 1,3-diethoxy-1,1,3,3-tetraphenyldisiloxane, and 1,3-diphenoxy-1,1,3,3-tetraphenyldisiloxane.

Of those, preferred compounds are hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,13,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy- 1,1,3,3-tetraphenyldisiloxane, and 1,3-diethoxy-1,1,3,3-tetraphenyldisiloxane.

Examples of the compounds represented by the formula (3) wherein d is 0 include hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, and 1,2-diphenoxy-1,1,2,2-tetraphenyldisilane.

Of those, preferred compounds are hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, and 1,2-diethoxy-1,1,2,2-tetraphenyldisilane.

Examples of the compounds represented by the formula (3) wherein $R^7$ is a group represented by —$(CH_2)_n$— include bis(trimethoxysilyl)methane, bis(triethoxysilyl)methane, bis(tri-n-propoxysilyl)methane, bis(triisopropoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(triisopropoxysilyl)ethane, 1,2-bis(tri-n-butoxysilyl)ethane, 1,2-bis(tri-sec-butoxysilyl)ethane, 1,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(diisopropoxymethylsilyl)-1-(triisopropoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-t-butoxymethylsilyl)-1-(tri-t-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(diisopropoxymethylsilyl)-2-(triisopropoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-t-butoxymethylsilyl)-2-(tri-t-butoxysilyl)ethane, bis (dimethoxymethylsilyl)methane, bis(diethoxymethylsilyl)methane, bis(di-n-propoxymethylsilyl)methane, bis(diisopropoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylsilyl)ethane, 1,2-bis(diethoxymethylsilyl)ethane, 1,2-bis(di-n-propoxymethyl)ethane, 1,2-bis(diisopropoxymethylsilyl)ethane, 1,2-bis(di-n-butoxymethylsilyl)ethane, 1,2-bis(di-sec-butoxymethylsilyl)ethane, 1,2-bis(di-t-butoxymethylsilyl)ethane, 1,2-bis(trimethoxysilyl)benzene, 1,2-bis(triethoxysilyl)benzene, 1,2-bis(tri-n-propoxysilyl)benzene, 1,2-bis(triisopropoxysilyl)benzene, 1,2-bis(tri-n- butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(triisopropoxysilyl)benzene, 1,3-bis(tri-n-butoxysilyl)benzene,1,3-bis(tri-sec-butoxysilyl)benzene, 1,3-bis(tri-t-butoxysilyl)benzene, 1,4-bis(trimethoxysilyl)benzene, 1,4-bis(triethoxysilyl)benzene, 1,4-bis(tri-n-propoxysilyl)benzene, 1,4-bis (triisopropoxysilyl)benzene, 1,4-bis(tri-n-butoxysilyl)benzene, 1,4-bis(tri-sec-butoxysilyl)benzene, and 1,4-bis (tri-t-butoxysilyl)benzene.

Of those, preferred compounds are bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)- 2-(trimethoxysilyl)ethane, 1-(diethoxymethylsilyl)-2-(triethoxysilyl)ethane, bis (dimethoxymethylsilyl)methane, bis(diethoxymethylsilyl)methane, 1,2-bis(dimethoxymethylsilyl)ethane, 1,2-bis (diethoxymethylsilyl)ethane, 1,2-bis (trimethoxysilyl)benzene, 1,2-bis (triethoxysilyl)benzene, 1,3-bis (trimethoxysilyl)benzene, 1,3-bis (triethoxysilyl)benzene, 1,4-bis (trimethoxysilyl)benzene, and 1,4-bis(triethoxysilyl)benzene.

In the invention, the compounds (1), (2), and (3) described above may be used alone or in combination of two or more thereof to constitute ingredient A.

When at least one silane compound selected from the group consisting of the compounds (1) to (3) as materials for ingredient (A) is hydrolyzed and condensed, water is preferably used in an amount of from 5 to 50 mol, more preferably from 7 to 30 mol, per mol of the sum of the $R^1O$—, $R^2O$—, $R^4O$—, and $R^5O$— groups. If water is added in an amount smaller than 5 mol, there is the case where a sufficient dielectric constant and sufficient modulus of elasticity are not obtained. If the amount of water added is larger than 50 mol, there is the case where polymer precipitation or gelation may occur during the hydrolysis and condensation reactions.

Alkali Catalyst:

An alkali catalyst is used in hydrolyzing and condensing at least one silane compound selected from the group consisting of the compounds (1) to (3) for producing the product of hydrolysis and condensation (A) for use in the invention. Examples of the alkali catalyst include inorganic bases and organic bases.

Examples of the inorganic bases include ammonia, sodium hydroxide, potassium hydroxide, barium hydroxide, and calcium hydroxide.

Examples of the organic bases include methanolamine, ethanolamine, propanolamine, butanolamine, N-methylmethanolamine, N-ethylmethanolamine, N-propylmethanolamine, N-butylmethanolamine, N-methylethanolamine, N-ethylethanolamine, N-propylethanolamine, N-butylethanolamine, N-methylpropanolamine, N-ethylpropanolamine, N-propylpropanolamine, N-butylpropanolamine, N-methylbutanolamine, N-ethylbutanolamine, N-propylbutanolamine, N-butylbutanolamine, N,N-dimethylmethanolamine, N,N-diethylmethanolamine, N,N-dipropylmethanolamine, N,N-dibutylmethanolamine, N,N-dimethylethanolamine, N,N-diethylethanolamine, N,N-dipropylethanolamine, N,N-dibutylethanolamine, N,N-dimethylpropanolamine, N,N-diethylpropanolamine, N,N-dipropylpropanolamine, N,N-dibutylpropanolamine, N,N-dimethylbutanolamine, N,N-diethylbutanolamine, N,N-dipropylbutanolamine, N,N-dibutylbutanolamine, N-methyldimethanolamine, N-ethyldimethanolamine, N-propyldimethanolamine, N-butyldimethanolamine, N-methyldiethanolamine, N-ethyldiethanolamine, N-propyldiethanolamine, N-butyldiethanolamine, N-methyldipropanolamine, N-ethyldipropanolamine, N-propyldipropanolamine, N-butyldipropanolamine, N-methyldibutanolamine, N-ethyldibutanolamine, N-propyldibutanolamine, N-butyldibutanolamine, N-(aminomethyl)methanolamine, N-(aminomethyl)ethanolamine, N-(aminomethyl)propanolamine, N-(aminomethyl)butanolamine, N-(aminoethyl)methanolamine, N-(aminoethyl)ethanolamine, N-(aminoethyl)propanolamine, N-(aminoethyl)butanolamine, N-(aminopropyl)methanolamine, N-(aminopropyl)ethanolamine, N-(aminopropyl)propanolamine, N-(aminopropyl)butanolamine, N-(aminobutyl)methanolamine, N-(aminobutyl)ethanolamine, N-(aminobutyl)propanolamine, N-(aminobutyl)butanolamine, methoxymethylamine, methoxyethylamine, methoxypropylamine, methoxybutylamine, ethoxymethylamine, ethoxyethylamine, ethoxypropylamine, ethoxybutylamine, propoxymethylamine, propoxyethylamine, propoxypropylamine, propoxybutylamine, butoxymethylamine, butoxyethylamine, butoxypropylamine, butoxybutylamine, methylamine, ethylamine, propylamine, butylamine, N,N-dimethylamine, N,N-diethylamine, N,N-dipropylamine, N,N-dibutylamine, trimethylamine, triethylamine, tripropylamine, tributylamine, tetramethylammonium hydroxide, tetraethylammonium hydroxide, tetrapropylammonium hydroxide, tetrabutylammonium hydroxide, tetramethylethylenediamine, tetraethylethylenediamine, tetrapropylethylenediamine, tetrabutylethylenediamine, methylaminomethylamine, methylaminoethylamine, methylaminopropylamine, methylaminobutylamine, ethylaminomethylamine, ethylaminoethylamine, ethylaminopropylamine, ethylaminobutylamine, propylaminomethylamine, propylaminoethylamine, propylaminopropylamine, propylaminobutylamine, butylaminomethylamine, butylaminoethylamine, butylaminopropylamine, butylaminobutylamine, pyridine, pyrrole, piperazine, pyrrolidine, piperidine, picoline, morpholine, methylmorpholine, diazabicyclooctane, diazabicyclononane, diazabicycloundecene, tetramethylammonium hydroxide, tetraethylammonium hydroxide, tetrapropylammonium hydroxide, and tetrabutylammonium hydroxide.

Those alkali catalysts may be used alone or as a mixture of two or more thereof.

The alkali catalyst is used in an amount of generally from 0.00001 to 0.5 mol, preferably from 0.00005 to 0.5 mol, per mol of the sum of the $R^1O$—, $R^2O$—, $R^4O$—, and $R^5O$— groups contained in the compounds (1) to (3). As long as the amount of the alkali catalyst used is within that range, there is little possibility that polymer precipitation or gelation might occur during the reactions.

The molecular weight of the product of hydrolysis and condensation (A) thus obtained is preferably from 50,000 to 3,000,000, more preferably from 100,000 to 2,000,000, most preferably from150,000 to 2,000,000, interms ofweight average molecular weight determined by the GPC (refractive index, viscosity, or light scattering) method. If the molecular weight of ingredient (A) is lower than 50, 000, there is the case where a sufficient dielectric constant and sufficient modulus of elasticity are not obtained. On the other hand, if the molecular weight thereof exceeds 3,000,000, there is the case where coating film uniformity decreases.

The product of hydrolysis and condensation (A) thus obtained is characterized by being not particulate and hence having excellent applicability to substrates. That the product of hydrolysis and condensation (A) is not particulate can be ascertained through examination with, e.g., a transmission electron microscope (TEM).

In ingredient (A), the proportion of the product of hydrolysis and condensation derived from each compound is as follows, in terms of the product of complete hydrolysis and condensation. The content of the product of hydrolysis and condensation derived from the compound (2) is generally from 25 to 75% by weight, preferably from 30 to 70% by weight, more preferably from 35 to 65% by weight, based on the sum of all the products of hydrolysis and condensation derived from the compounds (1) to (3). The content of the product of hydrolysis and condensation derived from the compound (1) and/or compound (3) is generally from 75 to 25% by weight, preferably from 70 to 30% by weight, more preferably from 65 to 35% by weight, based on the sum of all the products of hydrolysis and condensation derived from the compounds (1) to (3). When the content of the product of hydrolysis and condensation derived from the compound (2) is from 25 to 75% by weight based on the sum of all the products of hydrolysis and condensation derived from the compounds (1) to (3), then the coating film obtained has a high modulus of elasticity and, in particular, an exceedingly low dielectric constant.

The term "product of complete hydrolysis and condensation" as used herein means a product obtained by a process in which all the $R^1O$—, $R^2O$—, $R^4O$—, and $R^5O$— groups contained in the compound (1), (2), or (3) are hydrolyzed into SiOH groups and these SiOH groups are completely condensed to form siloxane structures.

In producing the product of hydrolysis and condensation (A), at least one silane compound selected from the group consisting of compounds (1) to (3) is hydrolyzed and condensed in the presence of an alkali catalyst so that the resulting product of hydrolysis and condensation preferably has a weight average molecular weight of from 50,000 to 3,000,000. It is preferred to adjust the pH of the resulting composition to 7 or lower.

Examples of techniques for pH adjustment include:

(1) to add a pH regulator;
(2) to distill off the alkali catalyst from the composition at ordinary or reduced pressure;
(3) to bubble a gas such as nitrogen or argon into the composition to thereby remove the alkali catalyst from the composition; and
(4) to remove the alkali catalyst from the composition with an ion-exchange resin. Those techniques may be used alone or in combination of two or more thereof.

Examples of the pH regulator include inorganic acids and organic acids.

Examples of the inorganic acids include hydrochloric acid, nitric acid, sulfuric acid, hydrofluoric acid, phosphoric acid, boric acid, and oxalic acid.

Examples of the organic acids include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acids, phthalic acid, fumaric acid, citric acid, tartaric acid, and succinic acid.

Such a pH regulator is used to adjust the pH of the composition to 7 or lower, preferably 1 to 6. The method described above which comprises regulating the weight average molecular weight of the product of hydrolysis and condensation to from 50,000 to 3,000,000 and then adjusting the pH thereof with the pH regulator to a value within that range produces the effect that the composition obtained has improved storage stability.

The pH regulator is used in an amount suitably selected so that the pH of the composition becomes a value within that range.

Product of Hydrolysis and Condensation (B)

The product of hydrolysis and condensation (B) is obtained by hydrolyzing and condensing, in the presence of a metal chelate compound catalyst, at least one silane compound selected from the group consisting of compounds (1) to (3).

Those compounds (1) to (3) are the same as the silane compounds used for the product of hydrolysis and condensation (A), and explanations thereon are hence omitted here.

When at least one silane compound selected from the group consisting of the compounds (1) to (3) as materials for ingredient (B) is hydrolyzed and condensed, water is preferably used in an amount of from 0.25 to 5 mol, more preferably from 0.3 to 3 mol, per mol of the sum of the $R^1O$—, $R^2O$—, $R^4O$—, and $R^5O$— groups. As long as the amount of water added is in the range of from 0.25 to 5 mol, there is no possibility that coating film uniformity might decrease and there is little possibility that polymer precipitation or gelation might occur during the hydrolysis and condensation reactions.

Metal Chelate Compound Catalyst:

A metal chelate compound catalyst is used in hydrolyzing and condensing at least one silane compound selected from the group consisting of the compounds (1) to (3) for producing the product of hydrolysis and condensation (B) for use in the invention.

Examples of the metal chelate compound include titanium chelate compounds such as triethoxymono(acetylacetonato) titanium, tri-n-propoxymono(acetylacetonato)titanium, triisopropoxymono(acetylacetonato)titanium, tri-n-butoxymono(acetylacetonato)titanium, tri-sec-butoxymono (acetylacetonato)titanium, tri-tert-butoxymono (acetylacetonato)titanium, diethoxybis(acetylacetonato) titanium, di-n-propoxybis(acetylacetonato)titanium, diisopropoxybis(acetylacetonato)titanium, di-n-butoxybis (acetylacetonato)titanium, di-sec-butoxybis (acetylacetonato)titanium, di-tert-butoxybis (acetylacetonato)titanium, monoethoxytris(acetylacetonato) titanium, mono-n-propoxytris(acetylacetonato)titanium, monoisopropoxytris(acetylacetonato)titanium, mono-n-butoxytris(acetylacetonato)titanium, mono-sec-butoxytris (acetylacetonato)titanium, mono-tert-butoxytris (acetylacetonato)titanium, tetrakis(acetylacetonato) titanium, triethoxymono(ethylacetoacetato)titanium, tri-n-propoxymono(ethylacetoacetato)titanium, triisopropoxymono(ethylacetoacetato) titanium, tri-n-butoxymono(ethylacetoacetato)titanium, tri-sec-butoxymono(ethylacetoacetato)titanium, tri-tert-butoxymono(ethylacetoacetato)titanium, diethoxybis (ethylacetoacetato)titanium, di-n-propoxybis (ethylacetoacetato)titanium, diisopropoxybis (ethylacetoacetato)titanium, di-n-butoxybis (ethylacetoacetato)titanium, di-sec-butoxybis (ethylacetoacetato)titanium, di-tert-butoxybis (ethylacetoacetato)titanium, monoethoxytris (ethylacetoacetato)titanium, mono-n-propoxytris (ethylacetoacetato)titanium, monoisopropoxytris (ethylacetoacetato)titanium, mono-n-butoxytris (ethylacetoacetato)titanium, mono-sec-butoxytris (ethylacetoacetato)titanium, mono-tert-butoxytris (ethylacetoacetato)titanium, tetrakis(ethylacetoacetato) titanium, mono(acetylacetonato)tris(ethylacetoacetato) titanium, bis(acetylacetonato)bis(ethylacetoacetato) titanium, and tris(acetylacetonato)mono(ethylacetoacetato) titanium; zirconium chelate compounds such as triethoxymono(acetylacetonato)zirconium, tri-n-propoxymono(acetylacetonato)zirconium, triisopropoxymono(acetylacetonato)zirconium, tri-n-butoxymono(acetylacetonato)zirconium, tri-sec-butoxymono(acetylacetonato)zirconium, tri-tert-butoxymono(acetylacetonato)zirconium, diethoxybis (acetylacetonato)zirconium, di-n-propoxybis (acetylacetonato)zirconium, diisopropoxybis (acetylacetonato)zirconium, di-n-butoxybis (acetylacetonato)zirconium, di-sec-butoxybis (acetylacetonato)zirconium, di-tert-butoxybis (acetylacetonato)zirconium, monoethoxytris (acetylacetonato)zirconium, mono-n-propoxytris (acetylacetonato)zirconium, monoisopropoxytris (acetylacetonato)zirconium, mono-n-butoxytris (acetylacetonato)zirconium, mono-sec-butoxytris (acetylacetonato)zirconium, mono-tert-butoxytris (acetylacetonato)zirconium, tetrakis(acetylacetonato) zirconium, triethoxymono(ethylacetoacetato)zirconium, tri-n-propoxymono(ethylacetoacetato)zirconium, triisopropoxymono(ethylacetoacetato)zirconium, tri-n-butoxymono(ethylacetoacetato)zirconium, tri-sec-butoxymono(ethylacetoacetato)zirconium, tri-tert-butoxymono(ethylacetoacetato)zirconium, diethoxybis (ethylacetoacetato)zirconium, di-n-propoxybis (ethylacetoacetato)zirconium, diisopropoxybis (ethylacetoacetato)zirconium, di-n-butoxybis (ethylacetoacetato)zirconium, di-sec-butoxybis (ethylacetoacetato)zirconium, di-tert-butoxybis (ethylacetoacetato)zirconium, monoethoxytris (ethylacetoacetato)zirconium, mono-n-propoxytris (ethylacetoacetato)zirconium, monoisopropoxytris (ethylacetoacetato)zirconium, mono-n-butoxytris (ethylacetoacetato)zirconium, mono-sec-butoxytris (ethylacetoacetato)zirconium, mono-tert-butoxytris (ethylacetoacetato)zirconium, tetrakis(ethylacetoacetato) zirconium, mono(acetylacetonato)tris(ethylacetoacetato) zirconium, bis(acetylacetonato)bis(ethylacetoacetato) zirconium, and tris(acetylacetonato)mono (ethylacetoacetato)zirconium; and aluminum chelate compounds such as tris(acetylacetonato)aluminum and tris (ethylacetoacetato)aluminum.

The metal chelate compound catalyst also is used in an amount of generally from 0.00001 to 0.5 mol, preferably from 0.00005 to 0.1 mol, per mol of the sum of the $R^1O—$, $R^2O—$, $R^4O—$, and $R^5O—$ groups contained in the compounds (1) to (3). As long as the amount of the metal chelate compound catalyst used is within that range, there is little possibility that polymer precipitation or gelation might occur during the reactions.

The molecular weight of the product of hydrolysis and condensation (B) thus obtained is preferably from 500 to 300,000, more preferably from 700 to 200,000, most preferably from 1,000 to 100,000, in terms of weight average molecular weight determined by the GPC (refractive index, viscosity, or light scattering) method. If the molecular weight of ingredient (B) is lower than 500, there is the case where coating film uniformity decreases. On the other hand, if the molecular weight thereof exceeds 300,000, there is the case where sufficient storage stability is not obtained.

The product of hydrolysis and condensation (B) thus obtained also is characterized by being not particulate and hence having excellent applicability to substrates. That the product of hydrolysis and condensation (B) is not particulate can be ascertained through examination with, e.g., a transmission electron microscope (TEM).

In producing the product of hydrolysis and condensation (B), at least one silane compound selected from the group consisting of compounds (1) to (3) is hydrolyzed and condensed in the presence of a metal chelate compound catalyst so that the resultingproduct of hydrolysis and condensation preferably has a weight average molecular weight of from 500 to 300,000. It is preferred to add a β-diketone to the resulting composition.

Examples of the β-diketone include acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, and 1,1,1,5,5,5-hexafluoro-2,4-heptanedione. Such β-diketones may be added alone or in combination of two or more thereof.

The β-diketone may be added in an amount of generally from 0.1 to 100 parts by weight, preferably from 0.2 to 80 parts by weight, per 100 parts by weight of ingredient (B) (in terms of the product of complete hydrolysis and condensation).

The addition of a β-diketone in an amount within that range is effective in obtaining a certain degree of storage stability and in diminishing the possibility of impairing properties including coating film uniformity.

It is preferred to add the β-diketone after the hydrolysis and condensation reactions for producing ingredient (B).
Proportions of Ingredient (A) and Ingredient (B)

In the composition for film formation of the invention, ingredients (A) and (B) are contained in such a proportion that the amount of the ingredient (B) (in terms of the product of complete hydrolysis and condensation) is preferably from 1 to 900 parts by weight, more preferably from3 to 800 parts by weight, most preferably from 5 to 800 parts by weight, per 100 parts by weight of the ingredient (A) (in terms of the product of complete hydrolysis and condensation). If the amount of the ingredient (B) is smaller than 1 part by weight, there is the case where the coating film obtained has insufficient mechanical strength. On the other hand, if the amount thereof exceeds 900 parts by weight, there is the case where a sufficiently low dielectric constant is not obtained.
Solvent (C)

The composition for film formation of the invention is obtained by dissolving or dispersing the product of hydrolysis and condensation (A) and the product of hydrolysis and condensation (B) in a solvent (C).

This solvent (C) may comprise at least one member selected from the group consisting of alcohol solvents, ketone solvents, amide solvents, and ester solvents.

Examples of the alcohol solvents include monohydric alcohols such as methanol, ethanol, n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6- dimethylheptanol-4, n-decanol, sec-undecylalcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, and diacetone alcohol;

polyhydric alcohols such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, and tripropylene glycol; and partial ethers of polyhydric alcohols, such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether.

Those alcohol solvents may be used alone or in combination of two or more thereof.

Of those alcohols, preferred alcohols are n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, propylene glycol monomethyl ether, propylene glycol monoethyl ether, propylene glycol monopropyl ether, and propylene glycol monobutyl ether.

Examples of the ketone solvents include acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonanone, cyclohexanone, 2-hexanone, methylcyclohexanone, 2,4-pentanedione, acetonylacetone, acetophenone, and fenchone. Examples thereof further include β-diketones such as acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, and 1,1,1,5,5,5-hexafluoro-2,4-heptanedione.

Those ketone solvents may be used alone or in combination of two or more thereof.

Examples of the amide solvents include formamide, N-methylformamide, N,N-dimethylformamide, N-ethylformamide, N,N-diethylformamide, acetamide, N-methylacetamide, N,N-dimethylacetamide, N-ethylacetamide, N,N-diethylacetamide, N-methylpropionamide, N-methylpyrrolidone, N-formylmorpholine, N-formylpiperidine, N-formylpyrrolidine, N-acetylmorpholine, N-acetylpiperidine, and N-acetylpyrrolidine.

Those amide solvents may be used alone or in combination of two or more thereof.

Examples of the ester solvents include diethyl carbonate, ethylene carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate.

Those ester solvents may be used alone or in combination of two or more thereof.

The solvents (C) enumerated above can be used alone or as a mixture of two or more thereof.

Although the composition for film formation of the invention contains the solvent (C), the same solvent can be used in hydrolyzing and/or condensing the compounds (1) to (3) as materials for ingredients (A) and (B).

For example, the reactions are conducted in the following manner. Water and an alkali catalyst (or a metal chelate compound catalyst) are added to the solvent (C). At least one member selected form the compounds (1) to (3) is then added to the solvent (C) at a time, intermittently, or continuously to conduct hydrolysis and condensation reactions. The reaction temperature in this case is generally from 0 to 100° C., preferably from 15 to 90° C.

Other additives

Ingredients such as surfactants may be added to the composition for film formation obtained in the invention.

Examples of the surfactants include nonionic surfactants, anionic surfactants, cationic surfactants, and amphoteric surfactants, and further include silicone surfactants, poly (alkylene oxide) surfactants, and fluorochemical surfactants.

The composition of the invention desirably contains no silica particles so as to give a uniform coating film.

Methods for Preparing the Composition

The composition of the invention may be prepared, for example, by adding water and an alkali catalyst (or a metal chelate compound catalyst) to a solvent (C), adding thereto at least one member (hereinafter referred to also as "silane compound") selected from the compounds (1) to (3) at a time, intermittently, or continuously, and conducting hydrolysis and condensation reactions while stirring the mixture at a temperature of generally from 0 to 100° C., preferably from 15 to 90° C., for 1 to 12 hours. The composition can be regulated so as to have any desired solid content by conducting concentration or dilution with the solvent (C) in each step in the preparation.

Specific examples of methods for preparing the composition of the invention include methods in which ingredient (A) or ingredient (B) is prepared, for example, by any of the following methods (1) to (12) and the ingredients (A) and (B) thus obtained are blended with each other.

(1) A prescribed amount of a silane compound is added to a mixture comprising water, an alkali catalyst (or a metal chelate compound catalyst), and a solvent (C), and hydrolysis/condensation reactions are conducted to obtain a product of hydrolysis and condensation (A) [or a product of hydrolysis and condensation (B)].

(2) A prescribed amount of a silane compound is continuously or intermittently added to a mixture comprising water, an alkali catalyst (or a metal chelate compound catalyst), and a solvent (C), and hydrolysis/condensation reactions are conducted to obtain a product of hydrolysis and condensation (A) [or a product of hydrolysis and condensation (B)].

(3) A mixture comprising water and an alkali catalyst (or a metal chelate compound catalyst) and optionally further comprising a solvent (C) is added to a mixture comprising a prescribed silane compound and a solvent (C), and hydrolysis/condensation reactions are conducted to obtain a product of hydrolysis and condensation (A) [or a product of hydrolysis and condensation (B)].

(4) A mixture comprising water and an alkali catalyst (or a metal chelate compound catalyst) and optionally further comprising a solvent (C) is continuously or intermittently added to a mixture comprising a prescribed silane compound and a solvent (C), and hydrolysis/condensation reactions are conducted to obtain a product of hydrolysis and condensation (A) [or a product of hydrolysis and condensation (B)].

(5) Water or a mixture comprising water and a solvent (C) as an optional ingredient is added to a mixture comprising a prescribed silane compound, an alkali catalyst (or a metal chelate compound catalyst), and a solvent (C), and hydrolysis/condensation reactions are conducted to obtain a product of hydrolysis and condensation (A) [or a product of hydrolysis and condensation (B)].

(6) Water or a mixture comprising water and a solvent (C) as an optional ingredient is continuously or intermittently added to a mixture comprising a prescribed silane compound, an alkali catalyst (or a metal chelate compound catalyst), and a solvent (C), and hydrolysis/condensation reactions are conducted to obtain a product of hydrolysis and condensation (A) [or a product of hydrolysis and condensation (B)].

(7) A mixture comprising a silane compound and an alkali catalyst (or a metal chelate compound catalyst) respectively in prescribed amounts and optionally further comprising a solvent (C) is added to either a prescribed amount of water or a mixture comprising a prescribed amount of water and a solvent (C) as an optional ingredient, and hydrolysis/ condensation reactions are conducted to obtain a product of hydrolysis and condensation (A) [or a product of hydrolysis and condensation (B)].

(8) A mixture comprising a silane compound and an alkali catalyst (or a metal chelate compound catalyst) respectively in prescribed amounts and optionally further comprising a solvent (C) is continuously or intermittently added to either a prescribed amount of water or a mixture comprising a prescribed amount of water and a solvent (C) as an optional ingredient, and hydrolysis/condensation reactions are conducted to obtain a product of hydrolysis and condensation (A) [or a product of hydrolysis and condensation (B)].

(9) A prescribed amount of an alkali catalyst (or a metal chelate compound catalyst) or a mixture comprising a prescribed amount of the catalyst and a solvent (C) as an optional ingredient is added to a mixture comprising water and a silane compound respectively in prescribed amounts and optionally further comprising a solvent (C), and hydrolysis/condensation reactions are conducted to obtain a product of hydrolysis and condensation (A) [or a product of hydrolysis and condensation (B)].

(10) A prescribed amount of an alkali catalyst (or a metal chelate compound catalyst) or a mixture comprising a prescribed amount of the catalyst and a solvent (C) as an optional ingredient is continuously or intermittently added to a mixture comprising water and a silane compound respectively in prescribed amounts and optionally further comprising a solvent (C), and hydrolysis/condensation reactions are conducted to obtain a product of hydrolysis and condensation (A) [or a product of hydrolysis and condensation (B)].

(11) A mixture comprising water and a silane compound respectively in prescribed amounts and optionally further comprising a solvent (C) is added to either a prescribed amount of an alkali catalyst (or a metal chelate compound catalyst) or a mixture comprising a prescribed amount of the catalyst and a solvent (C) as an optional ingredient, and hydrolysis/condensation reactions are conducted to obtain a product of hydrolysis and condensation (A) [or a product of hydrolysis and condensation (B)].

(12) A mixture comprising water and a silane compound respectively in prescribed amounts and optionally further comprising a solvent (C) is continuously or intermittently added to either a prescribed amount of an alkali catalyst (or a metal chelate compound catalyst) or a mixture comprising a prescribed amount of the catalyst and a solvent (C) as an optional ingredient, and hydrolysis/condensation reactions are conducted to obtain a product of hydrolysis and condensation (A) [or a product of hydrolysis and condensation (B)].

When the silane compound is hydrolyzed and condensed in the invention, the reaction mixture has a solid concentration of generally from 0.1 to 50% by weight.

The composition of the invention thus obtained has a total solid concentration of preferably from 2 to 50% by weight, more preferably from 2 to 30% by weight. The solid concentration thereof is suitably regulated according to purposes of the use thereof. When the composition has a total solid concentration of from 2 to 50% by weight, the composition not only gives a coating film having an appropriate thickness but has better storage stability.

The total solid concentration of the composition is regulated, according to need, by means of concentration or dilution with the solvent (C).

In forming a film from the composition of the invention, the composition of the invention is first applied to a substrate to form a coating film.

Examples of the substrate to which the composition of the invention is applicable include semiconductors, glasses, ceramics, and metals.

Examples of coating techniques that can be used include spin coating, dipping, and roller blade coating.

The composition of the invention is especially suitable for use in an application in which the composition is applied to a silicon wafer, $SiO_2$ wafer, SiN wafer, or the like to form an insulating film.

In this application, heating can be conducted with a hot plate, oven, furnace, or the like, for example, under atmospheric pressure, in a nitrogen or argon atmosphere, under vacuum, or under reduced pressure having controlled oxygen concentration.

This heat treatment is preferably conducted in a nitrogen or argon atmosphere, under vacuum, or under reduced pressure having an oxygen concentration of 100 ppm or lower and at a temperature of 450° C. or lower.

In order to control the curing rate of the ingredient (A), stepwise heating or a suitably selected atmosphere, such as a nitrogen, air, oxygen, or reduced-pressure atmosphere, can be used according to need.

The film of the invention thus obtained has a low dielectric constant, which is generally from 3.1 to 1.5, preferably from 3.0 to 1.5, more preferably from 2.7 to 1.5.

The film of the invention has a high modulus of elasticity, and the Young's modulus thereof is generally from 3 to 15 GPa, preferably from 4 to 15 GPa.

This high Young's modulus can be obtained by burning, by the method described above, the products of hydrolysis and condensation (A) and (B) prepared by any of the methods described above.

The film of the invention further has a density of generally from 0.5 to 1.4 g/cm$^3$, preferably from 0.5 to 1.3 g/cm$^3$, more preferably from 0.5 to 1.2 g/cm$^3$. If the density of the film is lower than 0.5 g/cm$^3$, the coating film has impaired mechanical strength. On the other hand, if the density thereof exceeds 1.4 g/cm$^3$, a low dielectric constant cannot be obtained.

Furthermore, the film of the invention is characterized by having low water absorption. For example, when the coating film is allowed to stand in an atmosphere of 127° C., 2.5 atm, and 100% RH for 1 hour, then no water adsorption on the coating film is observed by IR spectroscopy.

This low water absorption can be obtained, for example, by regulating the content of the product of hydrolysis and condensation derived from the compound (2) in the composition for film formation of the invention to a value within the range specified above.

The film of the invention has excellent insulating properties and a high modulus of elasticity. This coating film is excellent also in uniformity, dielectric constant characteristics, cracking resistance, and surface hardness. Consequently, this coating film is useful in applications such as interlayer insulating films for semiconductor devices such as LSIs, system LSIs, DRAMs, SDRAMs, RDRAMs, and D-RDRAMs, protective films such as surface coat films for semiconductor devices, interlayer insulating films for multilayered printed circuit boards, and protective or insulating films for liquid-crystal display devices.

The semiconductor device according to the invention has the film of the invention as an insulating film interposed between metallic wirings.

The invention will be explained below in more detail by reference to the following Examples. However, the following description merely shows general embodiment examples of the invention, and it should be understood that the invention is not construed as being limited by the description without particular reasons.

In the following Examples and Comparative Example, all "parts" and "percents" are by weight unless otherwise indicated.

Various properties were evaluated by the following methods.

Weight Average Molecular Weight

Measured by gel permeation chromatography (GPC) (refractive index, viscosity, or light scattering measurement) under the following conditions.

Sample solution: A product of the hydrolysis and condensation of silane compounds was diluted with methanol containing 10 mM LiBr to a solid concentration of 0.25% to prepare a sample solution for GPC (refractive index, viscosity, or light scattering measurement).

Apparatus:

GPC system: Model GPC-8020, manufactured by Tosoh Corp.

Column: Alpha 5000/3000, manufactured by Tosoh Corp.

Viscosity detector and light scattering detector:

Model T-60 Dual Meter, manufactured by Visco Tech Co.

Carrier solution: methanol containing 10 mM LiBr

Carrier feed rate: 1 ml/min

Column temperature: 40° C.

Storage Stability

In a glass bottle having a capacity of 100 ml equipped with a screw cap was placed 80 ml of a composition of the invention. This bottle was closed and allowed to stand in a 40° C. autoclave for 1 month. Before and after the standing, the sample was applied by spin coating under the conditions of 2,500 rpm and 31 seconds and then burned by the method shown in the Examples. The thickness of each of the thus-obtained coating films was measured with an ellipsometer (Spectra Laser 200, manufactured by Rudolph Technologies). The change in thickness, i.e., {[(thickness of film formed from the sample after standing)−(thickness of film formed from the sample before standing)]/(thickness of film formed from the sample before standing)}×100, was calculated, and the sample was evaluated based on the following criteria.

○: film thickness change<5%

◎: film thickness change<10%

X: film thickness change≧10%

Dielectric Constant

A sample for dielectric constant measurement was produced by forming an aluminum electrode pattern by vapor deposition on a film obtained. This sample was examined at a frequency of 100 kHz with electrodes HP16451B and precision LCR meter HP4284A, both manufactured by Yokogawa-Hewlett-Packard, Ltd., by the CV method to determine the dielectric constant of the coating film.

Film Density

The density of a film was calculated from the weight of the film and the volume thereof determined from the thickness and area of the film.

Modulus of Elasticity (Young's modulus)

A film obtained was examined with Nanoindenter XP (manufactured by MST) by a continuous method for rigidity measurement.

Water Absorption

A coating film obtained was allowed to stand in an atmosphere of 127° C., 2.5 atm, and 100% RH for 1 hour and then examined by IR spectroscopy to obtain an IR spectrum thereof. This IR spectrum was compared with an IR spectrum of the coating film which had not undergone the standing, and was examined for an absorption around 3,500 cm$^{-1}$ attributable to H$_2$O. Water absorption was evaluated based on the following criteria.

○: the spectrum did not have the absorption.

X: the spectrum had the absorption.

REFERENCE EXAMPLE 1

Preparation of Ingredient (A-1)

To a solution consisting of 5 g of 25% aqueous ammonia solution, 320 g of ultrapure water, and 600 g of ethanol were added 15 g of methyltrimethoxysilane (7.4 g in terms of the product of complete hydrolysis and condensation) and 20 g of tetraethoxysilane (5.8 g in terms of the product of complete hydrolysis and condensation). This mixture was reacted at 60° C. for 3 hours, and 200 g of propylene glycol monopropyl ether was then added thereto. The resulting mixture was concentrated under reduced pressure until the total amount of the solution decreased to 200 g. Thus, an ingredient (A-1) solution having a solid content of 6.6% was obtained. The ingredient (A-1) obtained had a weight average molecular weight of 300,000.

REFERENCE EXAMPLE 2

Preparation of Ingredient (A-2)

200 g of the ingredient (A) solution described in Reference Example 1 was further concentrated to a total solution amount of 140 g. To this concentrate was added 10 g of a 10% propylene glycol monopropyl ether solution of acetic acid. Thus, an ingredient (A-2) solution having a solid content of 8.8% was obtained. The ingredient (A-2) obtained had a weight average molecular weight of 300,000. The number of residual silanol groups counted by conductometric titration did not change through the addition of acetic acid.

REFERENCE EXAMPLE 3

Preparation of Ingredient (B)

To a solution consisting of 101.3 g of tetramethoxysilane (40.0 g in terms of the product of complete hydrolysis and condensation), 324.7 g of methyltrimethoxysilane (160.0 g in terms of the product of complete hydrolysis and condensation), 783.3 g of propylene glycol monopropyl ether, and diisopropoxybis(ethylacetoacetato)titanium (catalyst/SiOR ratio: 0.004 by mole) was added dropwise 176.8 g of water ($H_2O$/SiOR ratio: 1.0 by mol) over 1 hour with heating at 60° C. After completion of the addition, the mixture was further reacted at 60° C. for 2 hours and 100.0 g of acetylacetone was then added thereto. The resulting mixture was concentrated under reduced pressure until the total amount of the solution decreased to 1,000 g. Thus, an ingredient (B) solution having a solid content of 20% was obtained. The ingredient (B) obtained had a weight average molecular weight of 3,500.

REFERENCE EXAMPLE 4

Preparation of Ingredient (A-3)

The same procedure as in Reference Example 1 was followed, except that 0.5 g of 25% tetramethylammonium hydroxide was used in place of 5 g of 25% aqueous ammonia solution. Thus, an ingredient having a weight average molecular weight of 1,000,000 was obtained. This ingredient was treated in the same manner as in Reference Example 2 to obtain ingredient (A-3) having a weight average molecular weight of 1,000,000. The number of residual silanol groups counted by conductometric titration did not change through the addition of acetic acid.

REFERENCE EXAMPLE 5

276.01 g of methyltrimethoxysilane, 86.14 g of tetramethoxysilane and 0.0092 g of tetrakis(acetylacetonato) titanium were dissolved in 101 g of propylene glycol monoethylether in a quartz-made separable flask, and the resulting solution was stirred with a three-one motor to stabilize the solution at a solution temperature of 55° C. A mixed solution of 225.52 g of an ion-exchanged water and 263.00 g of propylene glycol monoethylether was added to the solution over 1 hour. After conducting the reaction at 55° C. for 4 hours, 48.12 g of acetyl acetone was added thereto, and the reaction was further conducted for 30 minutes. The reaction solution was cooled to room temperature. 227 g of a solution containing methanol and water was removed from the reaction solution by evaporation at 50° C. to obtain a reaction solution (B-2).

Weight average molecular weight of condensate and the like thus obtained was 1,230.

REFERENCE EXAMPLE 6

428 g of distilled water, 215 g of ion-exchanged water and 15.5 g of 25% tetramethylammonium hydroxide aqueous solution were introduced in a quartz-made separable flask, and then uniformly stirred. A mixture of 40.8 g of methyltrimethoxysilane and 61.4 g of tetraethoxysilane was added to the resulting solution. Reaction was conducted for 2 hours while maintaining the solution at 60° C. 300 g of propylene glycol monopropylether was added to the solution, and the resulting solution was condensed until reaching its concentration to 10% (calculated as completely hydrolyzed condensate) using an evaporator at 50° C. 20 g of 10% propylene glycol monopropylether aqueous solution of maleic acid was added to the solution to obtain a reaction solution (A-4).

Inertia radius of the condensate and the like thus obtained was 20.4 nm.

COMPARATIVE REFERENCE EXAMPLE 144.5 g of methyltrimethoxysilane, 180.3 g of tetramethoxysilane and 1.4 g of tetrakis(acetylacetonato) titanium were dissolved in 469 g of propylene glycol monoethylether in a quartz-made separable flask, and the resulting solution was stirred with a three-one motor to stabilize the solution at a solution temperature of 60° C. 71 g of an ion-exchanged water was added to the solution over 1 hour. Reaction was then conducted at 60° C. for 2 hours, and the reaction solution was cooled to room temperature. 200 g of a solution containing methanol was removed from the reaction solution by evaporation at 50° C. to obtain a reaction solution.

Weight average molecular weight of condensate and the like thus obtained was 9,400.

EXAMPLE 1

96.5 g of the ingredient (A-1) solution described in Reference Example 1 was mixed with 3.5 g of the ingredient (B) solution described in Reference Example 3 to obtain a composition solution having a solid content of 7.1%. The composition obtained was applied to an 8 inch silicon wafer by spin coating. The coated wafer was heated first at 80° C. in the air for 5 minutes and then at 200° C. in nitrogen for 5 minutes, subsequently heated under vacuum at 340° C., 360° C., and 380° C. in this order for 30 minutes each, and then heated under vacuum at 425° C. for 1 hour to form a colorless transparent film. The results of evaluations of the film obtained are shown in the Table below.

EXAMPLE 2

84.1 g of the ingredient (A-2) solution described in Reference Example 2 was mixed with 15.9 g of the ingredient (B) solution described in Reference Example 3 to obtain a composition solution having a solid content of 10.6%. The composition obtained was applied to an 8 inch silicon wafer by spin coating. The coated wafer was heated first at 80° C. in the air for 5 minutes and then at 200° C. in nitrogen for 5 minutes, subsequently heated under vacuum at 340° C., 360° C., and 380° C. in this order for 30 minutes each, and then heated under vacuum at 425° C. for 1 hour to form a colorless transparent film. The results of evaluations of the film obtained are shown in the Table below.

EXAMPLE 3

4.1 g of the ingredient (A-3) solution described in Reference Example 4 was mixed with 15.9 g of the ingredient (B) solution described in Reference Example 3 to obtain a composition solution having a solid content of 10.6%. The composition obtained was applied to an 8 inch silicon wafer by spin coating. The coated wafer was heated first at 80° C. in the air for 5 minutes and then at 200° C. in nitrogen for 5 minutes, subsequently heated under vacuum at 340° C., 360° C., and 380° C. in this order for 30 minutes each, and then heated under vacuum at 425° C. for 1 hour to form a colorless transparent film. The results of evaluations of the film obtained are shown in the Table below.

EXAMPLE 4

100 g of the reaction solution (A-2) described in Reference Example 6 was mixed with 20 g of the reaction solution (B-2) described in Reference Example 5 to obtain a composition solution having a solid content of 10.6%. The composition obtained was applied to an 8 inch silicon wafer by spin coating. The coated wafer was heated first at 80° C. in the air for 5 minutes and then at 200° C. in nitrogen for 5 minutes, subsequently heated under vacuum at 340° C., 360° C., and 380° C. in this order for 30 minutes each, and then heated under vacuum at 425° C. for 1 hour to form a colorless transparent film. The results of evaluations of the film obtained are shown in the Table below.

EXAMPLE 5

150 g of the reaction solution (A-4) described in Reference Example 6 was mixed with 10 g of the reaction solution (B-2) described in Reference Example 5 to obtain a composition solution having a solid content of 10.6%. The composition obtained was applied to an 8 inch silicon wafer by spin coating. The coated wafer was heated first at 80° C. in the air for 5 minutes and then at 200° C. in nitrogen for 5 minutes, subsequently heated under vacuum at 340° C., 360° C., and 380° C. in this order for 30 minutes each, and then heated under vacuum at 425° C. for 1 hour to form a colorless transparent film. The results of evaluations of the film obtained are shown in the Table below.

COMPARATIVE EXAMPLE 87.6 g of the composition solution described in Comparative Reference Example 1 was mixed with 12.4 g of the ingredient (B) solution described in Reference Example 3 to obtain a composition solution having a solid content of 8.3%. The composition obtained was applied to an 8 inch silicon wafer by spin coating. The coated wafer was heated first at 80° C. in the air for 5 minutes and then at 200° C. in nitrogen for 5 minutes, subsequently heated under vacuum at 340° C., 360° C., and 380° C. in this order for 30 minutes each, and then heated under vacuum at 425° C. for 1 hour to form a colorless transparent film. The results of evaluations of the film obtained are shown in the Table below.

TABLE

|  | Example 1 | Example 2 | Example 3 | Example 4 | Example 5 | Comparative Example |
|---|---|---|---|---|---|---|
| Storage stability | ◯ | ⊙ | ⊙ | ⊙ | ⊙ | ◯ |
| Dielectric constant | 2.4 | 2.6 | 2.5 | 2.56 | 2.38 | 3.2 |
| Film density (g/cm$^3$) | 1.2 | 1.3 | 1.3 | 1.3 | 1.2 | 1.6 |
| Modulus of elasticity (Gpa) | 4.6 | 6.3 | 6.8 | 7.5 | 5.5 | 3.4 |
| Water absorption | ◯ | ◯ | ◯ | ◯ | ◯ | X |

According to the invention, a polyorganosiloxane-based composition for film formation can be provided which gives a film having a low dielectric -constant and high modulus of elasticity and is useful as an interlayer insulating film material in the production of semiconductor devices and the like.

What is claimed is:

1. A composition for film formation which comprises (A) a product of hydrolysis and condensation obtained by hydrolyzing and condensing, in the presence of an alkali catalyst, at least one silane compound selected from the group consisting of compounds represented by the following formula (1), compounds represented by the following formula (2), and compounds represented by the following formula (3) and (B) a product of hydrolysis and condensation obtained by hydrolyzing and condensing, in the presence of a metal chelate compound catalyst, at least one silane compound selected from the group consisting of compounds represented by the following formula (1), compounds represented by the following formula (2), and compounds represented by the following formula (3):

$$R_a Si(OR^1)_{4-a} \quad (1)$$

wherein R represents hydrogen atom, fluorine atom, or a monovalent organic group; $R^1$ represents a monovalent organic group; and a is an integer of 1 or 2;

$$Si(OR^2)_4 \quad (2)$$

wherein $R^2$ represents a monovalent organic group;

$$R^3{}_b(R^4O)_{3-b}Si—(R^7)_d—Si(OR^5)_{3-c}R^6{}_c \quad (3)$$

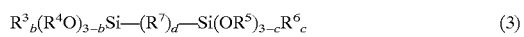

wherein $R^3$ to $R^6$ may be the same or different and each represent a monovalent organic group; b and c may be the same or different and each are an integer of 0 to 2; $R^7$ represents oxygen atom, a phenylene group, or a group represented by —(CH$_2$)$_n$—, wherein n is an integer of 1 to 6; and d is 0 or 1.

2. The composition for film formation as claimed in claim 1, wherein said product of hydrolysis and condensation as ingredient (A) has a weight average molecular weight as determined by GPC of from 50,000 to 3,000,000.

3. The composition for film formation as claimed in claim 1, wherein said product of hydrolysis and condensation as ingredient (B) has a weight average molecular weight as determined by GPC of from 500 to 300,000.

4. The composition for film formation as claimed in claim 1, wherein said ingredient (A) contains a product of the hydrolysis and condensation of at least one compound represented by the formula (2) in an amount of from 25 to 75% by weight in terms of the product of complete hydrolysis and condensation.

5. The composition for film formation as claimed in claim 1, which comprises 100 parts by weight of ingredient (A) in terms of the product of complete hydrolysis and condensation and from 1 to 900 parts by weight of said ingredient (B) in terms of the product of complete hydrolysis and condensation.

6. A method of film formation which comprises applying a composition for film formation on a substrate and then heating the composition, said composition for film formation comprising (A) a product of hydrolysis and condensation obtained by hydrolyzing and condensing, in the presence of an alkali catalyst, at least one silane compound selected from the group consisting of compounds represented by the following formula (1), compounds represented by the following formula (2), and compounds represented by the following formula (3) and (B) a product of hydrolysis and condensation obtained by hydrolyzing and condensing, in the presence of a metal chelate compound catalyst, at least one silane compound selected from the group consisting of compounds represented by the following formula (1), compounds represented by the following formula (2), and compounds represented by the following formula (3):

$$R_a Si(OR^1)_{4-a} \quad (1)$$

wherein R represents hydrogen atom, fluorine atom, or a monovalent organic group; $R^1$ represents a monovalent organic group; and a is an integer of 1 or 2;

$$Si(OR^2)_4 \quad (2)$$

wherein $R^2$ represents a monovalent organic group;

$$R^3{}_b(R^4O)_{3-b}Si-(R^7)_d-Si(OR^5)_{3-c}R^6{}_c \quad (3)$$

wherein $R^3$ to $R^6$ may be the same or different and each represent a monovalent organic group; b and c may be the same or different and each are an integer of 0 to 2; $R^7$ represents oxygen atom, a phenylene group, or a group represented by $-(CH_2)_n-$, wherein n is an integer of 1 to 6; and d is 0 or 1.

7. An insulating film obtained by the method of film formation as claimed in claim 6.

8. A semiconductor device having the insulating film as claimed in claim 7.

* * * * *